United States Patent
Kim et al.

(10) Patent No.: US 11,519,958 B2
(45) Date of Patent: Dec. 6, 2022

(54) SEMICONDUCTOR MODULE INSPECTION DEVICE WITH ROBOT

(71) Applicant: SAMSUNG ELECTRONICS CO., LTD., Suwon-si (KR)

(72) Inventors: Minwoo Kim, Cheonan-si (KR); Jinho Choi, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/142,438

(22) Filed: Jan. 6, 2021

(65) Prior Publication Data
US 2022/0018897 A1      Jan. 20, 2022

(30) Foreign Application Priority Data
Jul. 16, 2020    (KR) .......................... 10-2020-0088172

(51) Int. Cl.
    *G01R 31/28*    (2006.01)
(52) U.S. Cl.
    CPC ..... *G01R 31/2893* (2013.01); *G01R 31/2875* (2013.01)
(58) Field of Classification Search
    CPC .......................... G01R 31/28; G01R 31/2875; G01R 31/2893; H01L 21/677
    USPC .................................................... 324/757.04
    See application file for complete search history.

(56) References Cited

U.S. PATENT DOCUMENTS

| | | | |
|---|---|---|---|
| 6,433,294 B1 * | 8/2002 | Nemoto | G01R 31/31907 209/571 |
| 6,972,557 B2 | 12/2005 | Park | |
| 2002/0070144 A1 | 6/2002 | Shim et al. | |
| 2004/0216536 A1 | 11/2004 | Park | |

(Continued)

FOREIGN PATENT DOCUMENTS

| | | |
|---|---|---|
| JP | 2003-262658 A | 9/2003 |
| JP | 2008-224455 A | 9/2008 |

(Continued)

OTHER PUBLICATIONS

English Translation KR100674417B1 Test Chamber Unit for Testing Semiconductor Device (Year: 2007).*
English Translation KR101333435B1 Test Handler (Year: 2013).*

*Primary Examiner* — Jermele M Hollington
*Assistant Examiner* — Courtney G McDonnough
(74) *Attorney, Agent, or Firm* — Sughrue Mion, PLLC (57) ABSTRACT

A semiconductor module inspection device is provided. The semiconductor module inspection device includes a receiver to store semiconductor modules; a loader to receive a semiconductor module from the receiver; a testing unit to receive the semiconductor module from the loader and perform a test process on the semiconductor module; an unloader to receive the semiconductor module from the testing unit and provide the semiconductor module from the testing unit to the receiver; and robots for transporting the semiconductor module. The robots include: a first robot to transport the semiconductor module from the receiver to the loader, a second robot to transport the semiconductor module from the loader to the testing unit, a third robot to transport the semiconductor module from the testing unit to the unloader, and a fourth robot to transport the semiconductor module from the unloader to the receiver.

19 Claims, 8 Drawing Sheets

(56) References Cited

U.S. PATENT DOCUMENTS

2009/0232626 A1* 9/2009 Shiozawa .......... G01R 31/2893
414/806
2019/0335586 A1* 10/2019 Jang ...................... H05K 1/181

FOREIGN PATENT DOCUMENTS

| | | | | |
|---|---:|---|---:|---|
| JP | 4171119 | B2 | 10/2008 | |
| JP | 4670870 | B2 | 4/2011 | |
| JP | 2017-161326 | A | 9/2017 | |
| KR | 10-2002-0030552 | A | 4/2002 | |
| KR | 10-2006-0118824 | A | 11/2006 | |
| KR | 10-0674417 | B1 | 1/2007 | |
| KR | 10-0674418 | B1 | 1/2007 | |
| KR | 100674417 | A1 * | 1/2007 | ......... G01R 31/2867 |
| KR | 101333435 | B1 * | 11/2013 | ......... G01R 31/2862 |
| KR | 10-1864781 | B1 | 6/2018 | |

* cited by examiner

SEMICONDUCTOR MODULE INSPECTION DEVICE WITH ROBOT

CROSS-REFERENCE TO THE RELATED APPLICATION

This application claims priority from Korean Patent Application No. 10-2020-0088172, filed on Jul. 16, 2020, in the Korean Intellectual Property Office, the disclosure of which is incorporated herein by reference in its entirety.

BACKGROUND

1. Field

Apparatuses and methods consistent with example embodiments relate to an inspection device. In detail, example embodiments relate to a semiconductor module inspection device performing an electrical test for a semiconductor module.

2. Related Art

In accordance with recent advances in information communication, various semiconductor modules are being researched and developed. Semiconductor modules should have reliability as well as desired performance. Reliability of semiconductor modules is evaluated through a test process performed using inspection devices.

After manufacture thereof, semiconductor modules may be determined as good products or defective products based on results of an electrical performance test. The test process may be performed using a test handler for handling the semiconductor modules, and a tester provided in a chamber, the tester providing an inspection signal in order to inspect the semiconductor modules.

When semiconductor modules loaded in an inspection device are transported to the chamber, for a test process, the inspection device transports the semiconductor modules in groups using magazines or trays.

SUMMARY

One or more example embodiments provide a semiconductor module inspection device in which semiconductor modules loaded in the semiconductor module inspection device are directly loaded in a chamber.

One or more example embodiments provide a semiconductor module inspection device in which semiconductor modules which have been subjected to a test process are directly unloaded from a chamber.

One or more example embodiments provide a semiconductor module inspection device in which a test process is performed at various temperatures.

According to an aspect of the an example embodiment, a semiconductor module inspection device includes: a receiver configured to store a plurality of semiconductor modules; a loader configured to receive a semiconductor module, from among the plurality of semiconductor modules, from the receiver; a testing unit configured to receive the semiconductor module from the loader, and perform a test process on the semiconductor module; an unloader configured to receive the semiconductor module from the testing unit, and provide the semiconductor module from the testing unit to the receiver; and a plurality of robots for transporting the semiconductor module. The plurality of robots includes: a first robot configured to transport the semiconductor module from the receiver to the loader, a second robot configured to transport the semiconductor module from the loader to the testing unit, a third robot configured to transport the semiconductor module from the testing unit to the unloader, and a fourth robot configured to transport the semiconductor module from the unloader to the receiver.

According to an aspect of an example embodiment, a semiconductor module inspection device includes: a first stacker configured to receive a semiconductor module and stack the semiconductor module on other semiconductor modules; a loader configured to receive the semiconductor module from the first stacker; a first chamber configured to maintain an internal temperature thereof at a predetermined temperature; a second chamber configured to perform an electrical test process on the semiconductor module at the predetermined temperature; and a robot configured to move the semiconductor module from the loader to the first chamber. The predetermined temperature is between 70° C. and 130° C. or between −60° C. and −20° C.

According to an aspect of an example embodiment, a semiconductor module inspection device includes: a first stacker configured to receive a semiconductor module therein; a loader configured to receive the semiconductor module from the first stacker; a first chamber configured to receive the semiconductor module from the loader, the first chamber being configured to maintain an internal temperature thereof at a predetermined temperature; a second chamber comprising a tester configured to send and receive electrical signals to and from the semiconductor module, the second chamber being configured to perform a test process on the semiconductor module at the predetermined temperature; a third chamber configured to maintain a temperature between the predetermined temperature and a normal temperature; a first tray configured to move between the first chamber and the second chamber; a second tray configured to move between the second chamber and the third chamber; an unloader configured to receive the semiconductor module from the third chamber; a second stacker configured to receive the semiconductor module; a third stacker for receiving configured to receive the semiconductor module; a first robot configured to transport the semiconductor module from the first stacker to the loader; a second robot configured to transport the semiconductor module from the loader to the first chamber; a third robot configured to transport the semiconductor module from the first tray and insert the semiconductor module into the tester; a fourth robot configured to transport the semiconductor module from the third chamber to the unloader; and a fifth robot configured to transport the semiconductor module from the unloader to the second stacker or the third stacker, wherein the fifth robot is configured to place the semiconductor module on the second stacker based on the semiconductor module satisfying predetermined reference values in the test process, and place the semiconductor module on the third stacker based on the semiconductor module not satisfying one of the predetermined reference values in the test process.

BRIEF DESCRIPTION OF THE DRAWINGS

The above and other objects and features will become apparent from the following description of example embodiments with reference to the accompanying drawings in which.

DETAILED DESCRIPTION

The above and other aspects and features will become more apparent by describing in detail example embodiments with reference to the accompanying drawings. It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout.

Figure 1:
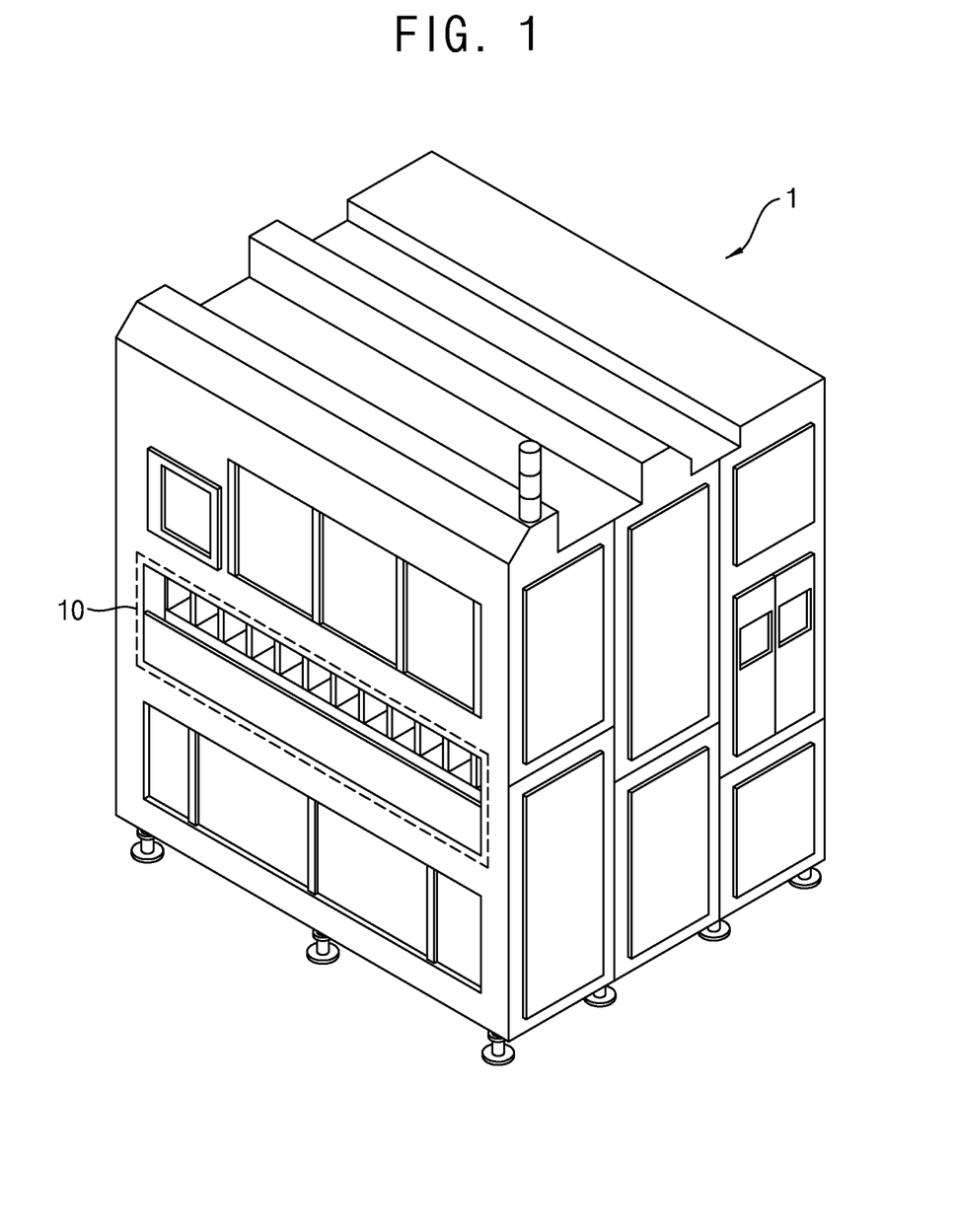
FIG. 1 is a view schematically showing a semiconductor module inspection device according to an example embodiment.
Figure 2:
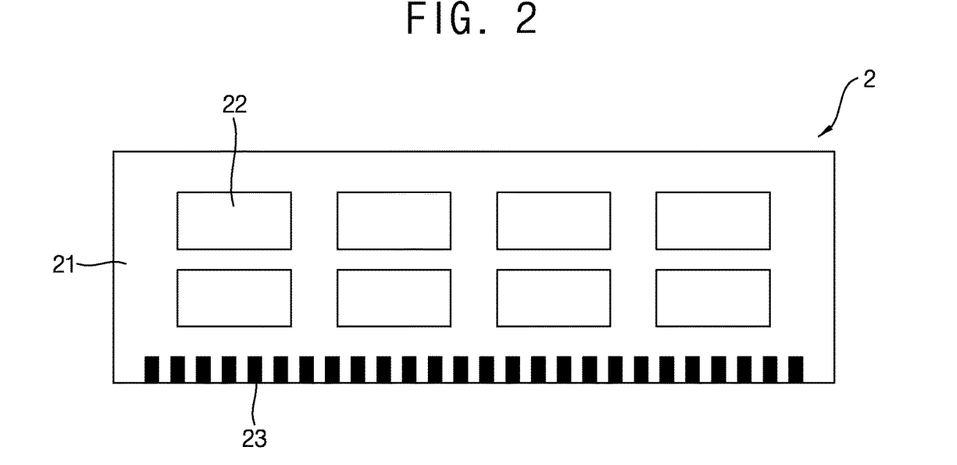
FIG. 2 is a view schematically showing the semiconductor module inspection device according to an example embodiment.

FIG. 1 is a view schematically showing a semiconductor module inspection device according to an example embodiment. FIG. 2 is a view schematically showing the semiconductor module inspection device according to an example embodiment.

Referring to FIGS. 1 and 2, a semiconductor module inspection device 1 (hereinafter referred to as an "inspection device") may be used in order to perform an electrical test process for a semiconductor module 2.

In an example embodiment, the inspection device 1 may have a substantially hexahedral shape. In accordance with example embodiments, the inspection device 1 may include a loading/unloading section 10 at one surface thereof. Through the loading/unloading section 10, a semiconductor module 2 may be loaded or unloaded. A receiver 100 may be disposed at the loading/unloading section 10 of the inspection device 1 in order to receive a semiconductor module 2 to be loaded in the inspection device 1 or to receive a semiconductor module 2 to be unloaded from the inspection device 1.

The semiconductor module 2 may be embodied as a random access memory device such as static random-access memory (SRAM), dynamic random-access memory (DRAM), synchronous dynamic random-access memory (SDRAM), phase-change random access memory (PRAM), magnetic RAM (MRAM), ferroelectric RAM (FRAM), resistive RAM (RRAM), etc.

In an example embodiment, the semiconductor module 2 may include a module substrate 21, semiconductor packages 22, and tabs 23.

The module substrate 21 may be a printed circuit board (PCB) having a circuit pattern. The module substrate 21 may have surfaces opposing each other. In an example embodiment, the module substrate 21 may have a rectangular shape when viewed in a plane.

Semiconductor packages 22 may be mounted on at least one of the opposite surfaces of the module substrate 21. A part of the semiconductor packages 22 may function as a logic package or a buffer package. Another part of the semiconductor packages 22 may include DRAM, SRAM, SDRAM, PRAM, MRAM, FRAM or RRAM.

The tabs 23 may be provided adjacent to one side of the module substrate 21. For example, the tabs 23 may be provided adjacent to a longer side of the module substrate 21. The tabs 23 may be aligned in one direction at one side of the module substrate 21.

The tabs 23 may be a part of a conductive pattern of the module substrate 21 exposed through a passivation layer.

The function and disposition of the tabs 23 may be standardized. For example, the function and disposition of the tabs 23 may meet the Joint Electron Device Engineering Council (JEDEC) Standard.

A part of the tabs 23 may function as input/output terminals for data signals. Another part of the tabs 23 may function as a transmission passage for a command/address (C/A) signal.

Figure 3:
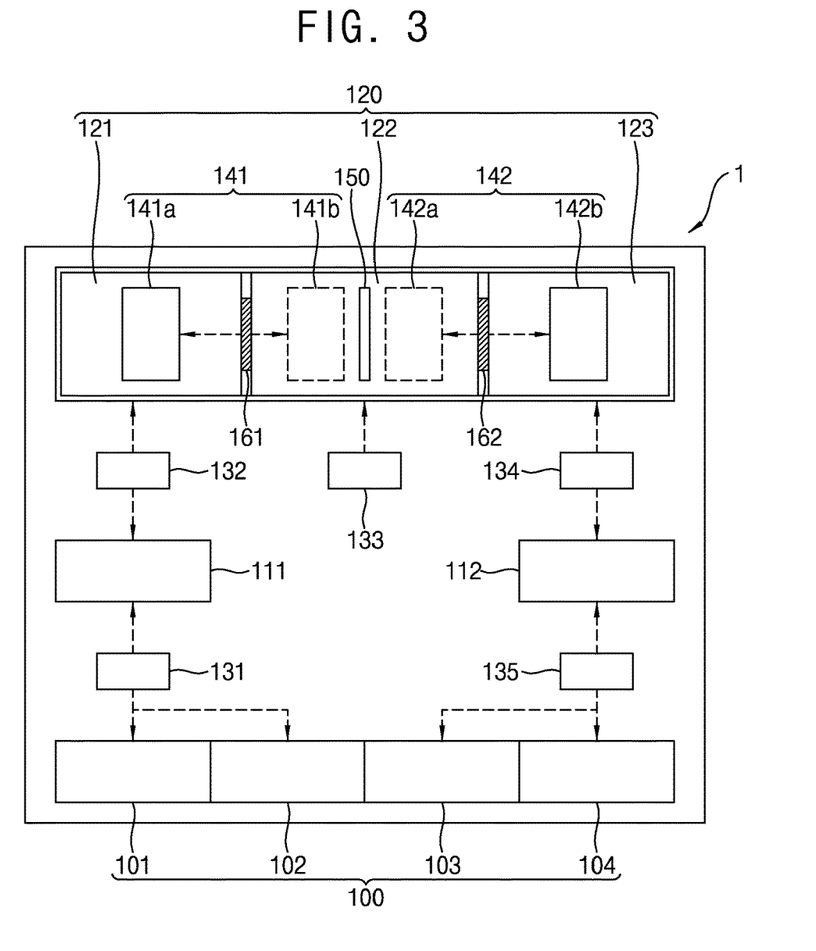
FIG. 3 is a block diagram schematically showing a semiconductor module inspection device according to an example embodiment.

FIG. 3 is a block diagram schematically showing a semiconductor module inspection device according to an example embodiment.

Referring to FIG. 3, an inspection device 1 may include a receiver 100, a loader 111, an unloader 112, a tester unit 120, and a plurality of robots 131 to 135.

In an example embodiment, the receiver 100 may include a plurality of stackers 101 to 104. For example, the receiver 100 may include a first stacker 101, a second stacker 102, a third stacker 103, and a fourth stacker 104.

At least one semiconductor module 2 may be stacked in each stacker. For example, when more than one semiconductor module 2 is stacked in one of the stackers, the semiconductor modules 2 may be stacked in a vertical direction.

In an example embodiment, semiconductor modules 2, which have not been subjected to a test process, may be stacked in the first stacker 101 and the second stacker 102. In an example embodiment, a test process for the semiconductor modules 2 stacked in the second stacker 102 may be performed after completion of a test process for the semiconductor modules 2 stacked in the first stacker 1.

Semiconductor modules 2, which satisfy predetermined reference values in test lists in the test process, may be stacked in the third stacker 103. Semiconductor modules 2, which do not satisfy a predetermined reference value in at least one of the test lists in the test process, may be stacked in the fourth stacker 104.

In an example embodiment, the first stacker 101, the second stacker 102, the third stacker 103 and the fourth stacker 104 may be aligned in one direction. Although the first stacker 101, the second stacker 102, the third stacker 103 and the fourth stacker 104 are illustrated as being aligned in one direction in this order, embodiments are not limited thereto.

A semiconductor module 2 may be provided from the first stacker 101 (or the second stacker 102) to the loader 111. In an example embodiment, a first robot 131 may transport a semiconductor module 2 stacked in the first stacker 101 (or the second stacker 102) to the loader 111.

In an example embodiment, a plurality of semiconductor modules 1 to be tested may be received in the loader 111. The loader 111 may align semiconductor modules 2 supplied from the first stacker 101 and the second stacker 102. For example, a plurality of semiconductor modules 2 may be aligned in a matrix in the loader 111. In an example embodiment, the loader 111 may be provided in the form of a tray as a transporting and handling tool in which semiconductor modules 2 are received. The loader 111 may be referred to as a "loading buffer".

In accordance with example embodiments, the loader 111 may apply heat of a predetermined temperature to the semiconductor modules 2.

A second robot 132 may transfer a semiconductor module 2 from the loader 111 to a first chamber 121 of the tester unit 120. The second robot 132 may be a shift robot. The second robot 132 may pick up a semiconductor module 2 disposed in the loader 111, may move towards the first chamber 121, and may then directly place the semiconductor module 2 in the first chamber 121.

In an example embodiment, the tester unit 120 may include the first chamber 121, a second chamber 122, and a third chamber 123.

In an example embodiment, the first chamber 121, the second chamber 122, and the third chamber 123 may be aligned in one direction. The second chamber 122 may be disposed between the first chamber 121 and the third chamber 123. In accordance with example embodiments, the first chamber 121 and the second chamber 122 may include side surfaces contacting each other, respectively, and the second chamber 122 and the third chamber 123 may include side surfaces contacting each other, respectively.

In an example embodiment, the first chamber 121 may be a soak chamber. The first chamber 121 may adjust a temperature of a semiconductor module 2 to be a test temperature. For example, the test temperature may be a high temperature between about 70° C. and 130° C. or a low temperature between about −60° C. and −20° C. For example, the first chamber 121 may be controlled to be the test temperature, and the semiconductor module 2 may be held in the first chamber 121 until the semiconductor module 2 is the test temperature.

In an example embodiment, the second chamber 122 may be a test chamber. The second chamber 122 may be a chamber for electrically testing a semiconductor module 2 at a predetermined temperature. The second chamber 122 may include a tester 150, into which a semiconductor module 2 is inserted. The tester 150 may provide a test signal to the semiconductor module 2 in order to electrically test the semiconductor module 2. An interface board may be mounted at the tester 150 in order to connect the semiconductor module 2 and the tester 150.

In an example embodiment, a third chamber 123 may be a de-soak chamber. The third chamber 123 may be a chamber for recovery of the temperature of the semiconductor module 2 to normal temperature after test. For example, the third chamber 123 may not be controlled to be the test temperature, and the semiconductor module 2 may be held in the third chamber 123 until the semiconductor module 2 is the normal temperature or a temperature in between the test temperature and the normal temperature.

In an example embodiment, the inspection device 1 may further include a first tray 141 which moves between the first chamber 121 and the second chamber 122, a second tray 142 which moves between the second chamber 122 and the third chamber 123, a first door 161 for selectively allowing communication between the first chamber 121 and the second chamber 122 through opening/closing thereof, and a second door 162 for selectively allowing communication between the second chamber 122 and the third chamber 123 through opening/closing thereof.

The first door 161 may be disposed between the first chamber 121 and the second chamber 122. In accordance with example embodiments, the first door 161 may be provided at each of the first chamber 121 and the second chamber 122. For example, the first door 161 may include two separated sidewalls, each of which corresponds to one of the first chamber 121 and the second chamber 122. Alternatively, the first door 161 may be disposed between the first chamber 121 and the second chamber 122 such that the first chamber 121 and the second chamber 122 share the first door 161 with each other.

The first door 161 may open and close side walls thereof, to which the first chamber 121 and the second chamber 122 are adjacent, in order to allow the first tray 141 to move between the first chamber 121 and the second chamber 122. For example, when the first tray 141 moves from the first chamber 121 to the second chamber 122 or from the second chamber 122 to the first chamber 121, the first door 161 may open the side walls, to which the first chamber 121 and the second chamber 122 are adjacent. In addition, when the first tray 141 stands by in the first chamber 121 or the second chamber 122 (for example, during execution of a test process), the first door 161 may close the side walls, to which the first chamber 121 and the second chamber 122 are adjacent, thereby spatially separating the first chamber 121 and the second chamber 122 from each other. In the drawing, the case in which the first tray 141 stands by in the first chamber 121 is indicated by reference number "141*a*", whereas the case in which the first tray 141 stands by in the second chamber 122 is indicated by reference numeral "141*b*".

The second door 162 may be disposed between the second chamber 122 and the third chamber 123. In accordance with example embodiments, the second door 162 may be provided at each of the second chamber 122 and the third chamber 123. For example, the second door 162 may include two separated sidewalls, each of which corresponds to one of the second chamber 122 and the third chamber 123. Alternatively, the second door 162 may be disposed between the second chamber 122 and the third chamber 123 such that the second chamber 122 and the third chamber 123 share the second door 162 with each other.

The second door 162 may open and close side walls thereof, to which the second chamber 122 and the third chamber 123 are adjacent, in order to allow the second tray 142 to move between the second chamber 122 and the third chamber 123. For example, when the second tray 142 moves from the second chamber 122 to the third chamber 123 or from the third chamber 123 to the second chamber 122, the second door 162 may open the side walls, to which the second chamber 122 and the third chamber 123 are adjacent. In addition, when the second tray 142 stands by in the second chamber 122 or the third chamber 123 (for example, during execution of a test process), the second door 162 may close the side walls, to which the second chamber 122 and the third chamber 123 are adjacent, thereby spatially separating the second chamber 122 and the third chamber 123 from each other. In the drawing, the case in which the second tray 142 stands by in the second chamber 122 is indicated by reference number "142*a*", whereas the case in which the second tray 142 stands by in the third chamber 123 is indicated by reference numeral "142*b*".

The second robot 132 may place, in the first chamber 121, a semiconductor module 2, which has been disposed in the loader 111 in an aligned state, and may then place the semiconductor module 2 on the first tray 141 standing by in the first chamber 121. Thereafter, the second chamber 122 may adjust the temperature of the semiconductor module 2 on the first tray 141 to a test temperature. Subsequently, the first tray 141 may move the semiconductor module 2 to the second chamber 122.

The third robot 133 may pick up the semiconductor module 2 placed on the first tray 141 after being loaded in the second chamber 122. After the third robot 133 picks up the semiconductor module 2, the first tray 141 may move from the second chamber 122 to the first chamber 121. After movement of the first tray 141 to the first chamber 121, the third robot 133 may insert the picked-up semiconductor module 2 into the tester 150. The tester 150 may execute a test process for the semiconductor module 2 at the test temperature, which may either be a predetermined high temperature or a predetermined low temperature.

After completion of the test process, the third robot 133 may pick up the semiconductor module 2 inserted into the tester 150. Thereafter, the second tray 142 may enter the second chamber 122, and the third robot 133 may then place the semiconductor module 2 which has been subjected to the test process on the entered second tray 142. The second tray 142 may move the semiconductor module 2 from the second chamber 122 to the third chamber 123.

The semiconductor module 2 moved to the third chamber 123 may stand by in the third chamber 123 for a predetermined time. In accordance with example embodiments, the semiconductor module 2 in the third chamber 123 may be maintained at a temperature between a test temperature and normal temperature (for example, 20 to 25° C.). After passage of the predetermined time, the fourth robot 134 may unload the semiconductor module 2 from the second tray 142, and may then move the unloaded semiconductor module 2 to the unloader 112.

In an example embodiment, a plurality of semiconductor modules 2 which have been subjected to the test process may be received in the unloader 112. The unloader 112 may align semiconductor modules 2 supplied from the tester unit 120.

The fifth robot 135 may transport a plurality of semiconductor modules 2 which have been subjected to the test process to the third stacker 103 or the fourth stacker 104. For example, the fifth robot 135 may transport, to the third stacker 103, semiconductor modules 2, which satisfy predetermined reference values in test lists in the test process, while transporting, to the fourth stacker 104, semiconductor modules 2, which do not satisfy a predetermined reference value in at least one of the test lists.

Figure 4:
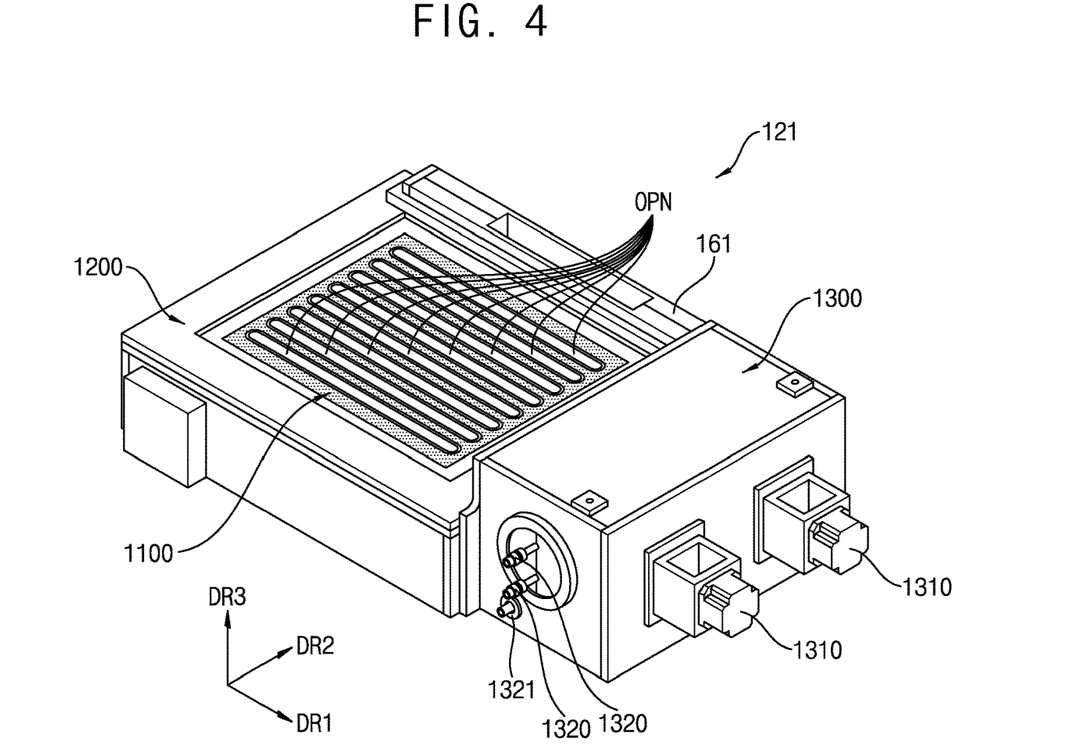
FIG. 4 is a perspective view schematically showing the first chamber according to an example embodiment.
Figure 5:
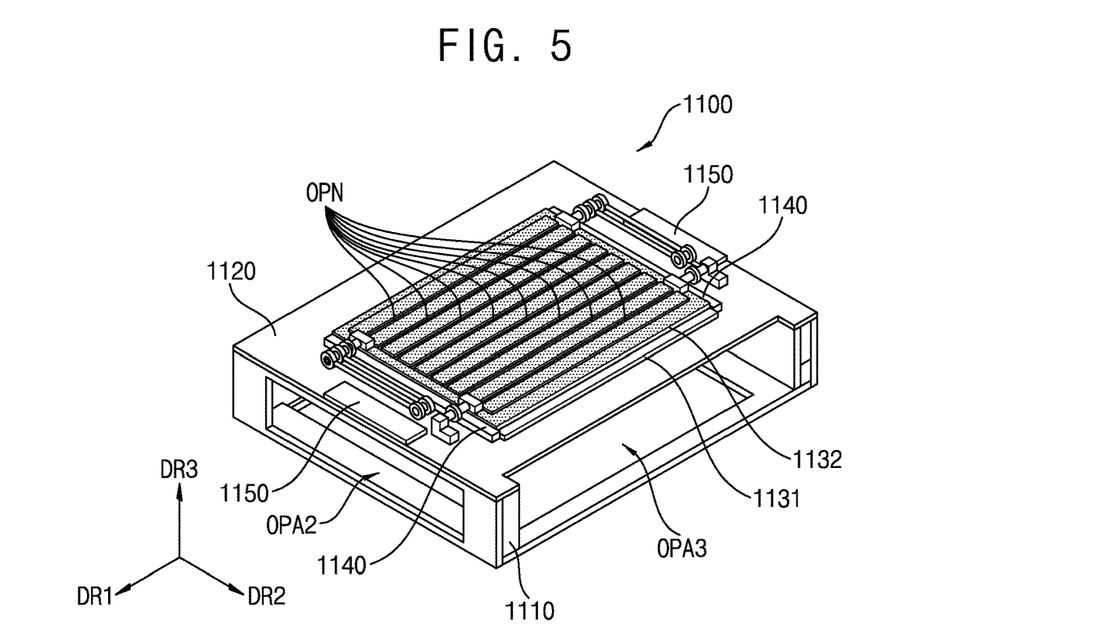
FIG. 5 is a perspective view showing the first chamber of FIG. 4, according to an example embodiment.
Figure 6:
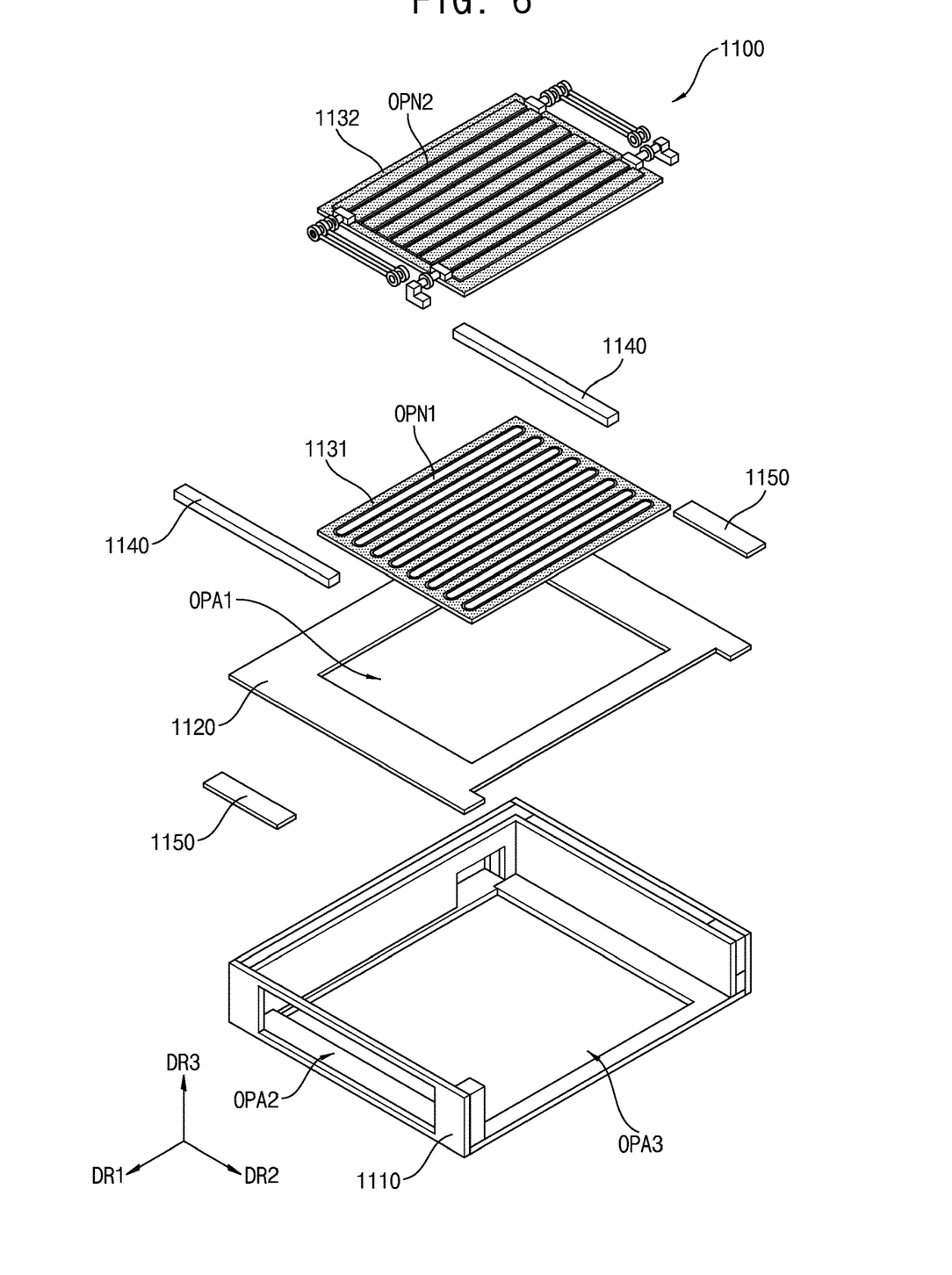
FIG. 6 is an exploded perspective view showing the first chamber of FIG. 4, according to an example embodiment.

FIG. 4 is a perspective view schematically showing the first chamber according to an example embodiment. FIG. 5 is a perspective view showing the first chamber of FIG. 4, according to an example embodiment. FIG. 6 is an exploded perspective view showing the first chamber of FIG. 4, according to an example embodiment.

In the drawings, a first direction DR1 represents an X-axis direction, a second direction DR2 represents a Y-axis direction, and a third direction DR3 represents a Z-axis direction. The first direction DR1, the second direction DR2 and the third direction DR3 are indicated in order to represent relative directions in the drawings.

Referring to FIGS. 4 to 6, the first chamber 121 may include an inner frame 1100, an outer frame 1200, and a temperature controller 1300.

The inner frame 1100 may include a lower frame 1110, an upper frame 1120, a first upper cover 1131, a second upper cover 1132, an air curtain nozzle 1140, and a heater block 1150.

The lower frame 1110 and the upper frame 1120 may define an intra-chamber space. For example, the lower frame 1110 may constitute a side surface and a lower surface of a chamber, and the upper frame 1120 may constitute an upper surface of the chamber.

In an example embodiment, the upper frame 1120 may include a first open area OPA1 exposing an interior of the chamber. In an example embodiment, the first open area OPA1 may have a rectangular shape. The first open area OPA1 may be an area where the first upper cover 1131 and the second upper cover 1132 are disposed.

In an example embodiment, the lower frame 1110 may include, at one surface thereof, a second open area OPA2 exposing the interior of the chamber. The lower frame 1110 may also include, at another surface thereof, a third open area OPA3 exposing the interior of the chamber. In an example embodiment, the one surface and the other surface may be surfaces adjacent to each other, respectively. In an example embodiment, the second open area OPA2 may be an area to which the temperature controller 1300 is coupled. The third open area OPA3 may be an area through which the first tray 141 moving as described above can pass. The third open area OPA3 may be an area where the first door 161 is disposed or an area adjacent to the first door 161.

In an example embodiment, the upper frame 1120 may include epoxy glass. The lower frame 1110 may be constituted by elements including one of epoxy glass, an aluminum alloy (for example, A6061) and stainless steel (for example, STS304).

The air curtain nozzle 1140 may be disposed on the upper frame 1120 at a position adjacent to the first open area OPA1. In an example embodiment, the air curtain nozzle 1140 may be provided in plural within the inner frame 1100. For example, two air curtain nozzles 1140 may be provided at the inner frame 1100. In this case, one air curtain nozzle 1140 may be disposed adjacent to one side of the first open area OPA1, whereas the other air curtain nozzle 1140 may be disposed adjacent to a side of the first open area OPA1 opposite to the former lateral side. The two air curtain nozzles 1140 may face each other. The two air curtain nozzles 1140 may inject gas. The injected gas may be sprayed to cover the first open area OPA1 (in particular, the inlets). The sprayed gas may form an air curtain, thereby minimizing external discharge of hot air or cool air from the interior of the inner frame 1100. As the first chamber 121 includes the air curtain nozzle 1140, it may be possible to avoid thermal loss from the interior of the first chamber 121 when a semiconductor module 2 is loaded into or unloaded from the first chamber 121.

The heater block 1150 may be disposed on the upper frame 1120. In an example embodiment, the heater block 1150 may be provided in plural within the inner frame 1100. For example, two heater blocks 1150 may be provided at the inner frame 1100. In this case, the heater blocks 1150 may be disposed outside positions where the air curtain nozzles 1140 are disposed, respectively. The heater block 1150 may include a function for adjusting the temperature of the upper frame 1120. When the inner space of the first chamber 121 is adjusted to a test temperature, the heater block 1150 may apply hot air or cool air such that the temperature of the upper frame 1120 is increased or decreased to a temperature between the test temperature and ambient temperature in order to avoid damage to the upper frame 1120 due to an external temperature difference.

The first upper cover 1131 and the second upper cover 1132 may be disposed in the open area OPA1 of the upper frame 1120. In an example embodiment, the second upper cover 1132 may be disposed on the first upper cover 1131. For example, the second upper cover 1132 may contact an exterior of the first chamber 121, and the first upper cover 1131 may contact an interior of the first chamber 121.

The first upper cover 1131 and the second upper cover 1132 may define an inlet OPN, through which a plurality of semiconductor modules 2 may be loaded into the first chamber 121. A plurality of inlets OPN having a length extending in one direction may be provided at each of the first upper cover 1131 and the second upper cover 1132. For example, the first chamber 121 may include 8 inlets OPN. That is, the first upper cover 1131 may include 8 first inlets OPN1, and the second upper cover 1132 may include 8 second inlets OPN2. The first inlets OPN1 may be disposed in parallel in one direction, and the second inlets OPN2 may be disposed in parallel in one direction. In an example embodiment, the length of each of the inlets OPN1 and OPN2 may be two times the length of each semiconductor module 2.

In an example embodiment, a cylinder may be provided at a side portion of the second upper cover 1132. Accordingly, the second upper cover 1132 may move. For example, the second upper cover 1132 may be offset in upward and downward directions and in left and right directions. For example, the cylinder is provided in parallel to the second upper cover 1132, and enable to push and pull the second upper cover 1132. In a state in which the first inlets OPN1 and the second inlets OPN2 do not overlap with each other, the inlets OPN of the first chamber 121 may be opened or closed in accordance with whether or not the second upper cover 1132 is offset. For example, when the second inlets OPN2 do not overlap with the first inlets OPN1, the inlets OPN of the first chamber 121 are in a closed state and, as such, the interior of the first chamber 121 and the exterior of the first chamber 121 may be spatially separated from each other. When the second upper cover 1132 is offset such that the second inlets OPN2 overlap with the first inlets OPN1, the inlets OPN of the first chamber 121 are in an opened state and, as such, the interior of the first chamber 121 and the exterior of the first chamber 121 may be spatially connected to each other.

In accordance with example embodiments, the first chamber 121 may include a door for the second inlets OPN2 of the second upper cover 1132 and, as such, may spatially separate or connect the interior of the first chamber 121 and the exterior of the first chamber 121 in accordance with closing or opening of the door.

In an example embodiment, the first upper cover 1131 and the second upper cover 1132 may include epoxy glass.

The outer frame 1200 may be formed to surround the inner frame 1100. The outer frame 1200 may include open areas in areas overlapping with the first open area OPA1, the second open area OPA2 and the third open area OPA3, respectively. The outer frame 1200 may include a function for protecting the inner frame 1100. For example, the outer frame 1200 may protect the inner frame 1100 from damage caused by a temperature difference between the interior of the first chamber 121 and the exterior of the first chamber 121 (for example, a coefficient of thermal expansion difference) or external physical impact.

In an example embodiment, the outer frame 1200 may include an aluminum alloy (for example, A6061).

The temperature controller 1300 may be coupled to the first chamber 121 through the second open area OPA2. The temperature controller 1300 may perform temperature control such that the internal temperature of the first chamber 121 becomes a test temperature. For example, the temperature controller 1300 may apply hot air or cool air to increase or decrease the internal temperature of the first chamber 121. The temperature controller 1300 may include at least one hot air injector 1310 at one surface thereof, and at least one cool air injector 1320 at the other surface thereof. The temperature controller 1300 may further include a refrigerant injector 1321 disposed adjacent to the cool air injector 1320. Hot air may be supplied to the hot air injector 1310 in order to increase the internal temperature of the first chamber 121. Cool air may be supplied to the cool air injector 1320 in order to decrease the internal temperature of the first chamber 121. A refrigerant may be supplied to the refrigerant injector 1321 in order to effectively decrease the internal temperature of the first chamber 121.

Figure 7:
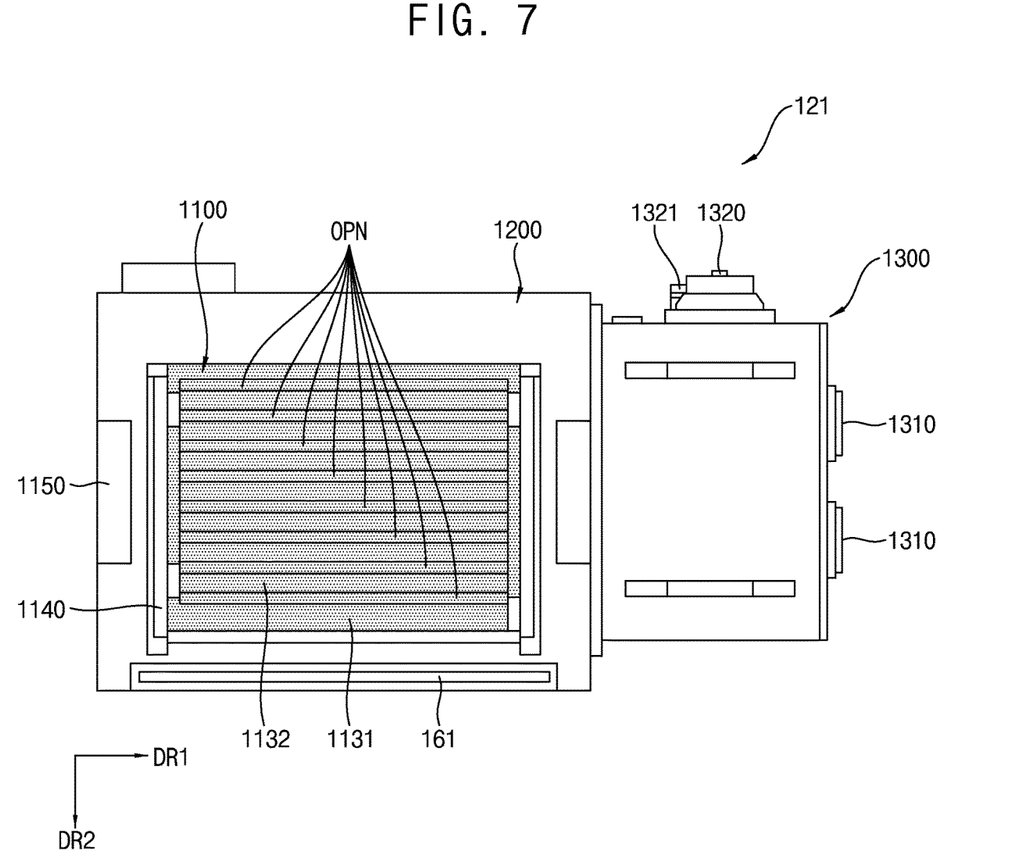
FIG. 7 shows a top view of the first chamber in a state in which inlets of the first chamber are closed, according to an example embodiment.
Figure 8:
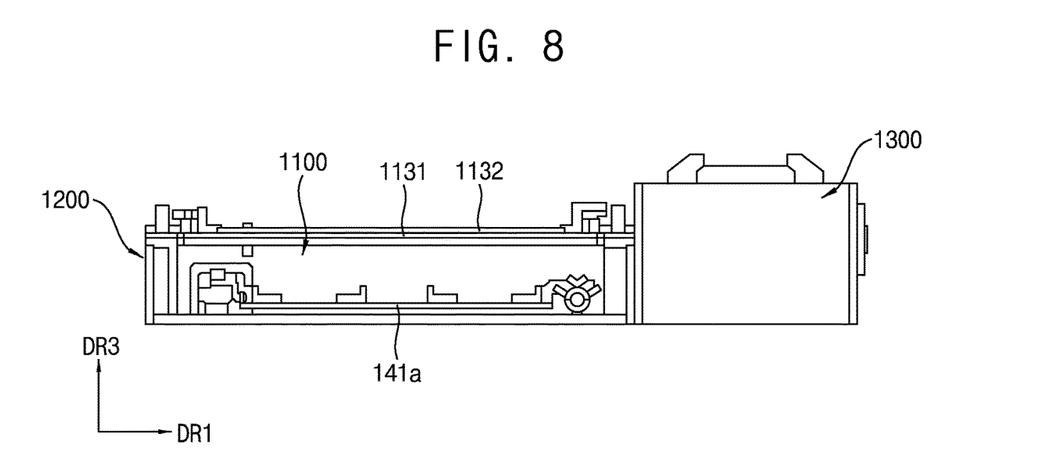
FIG. 8 shows an inner side view of the first chamber in the state in which the inlets of the first chamber are closed, according to an example embodiment.
Figure 9:
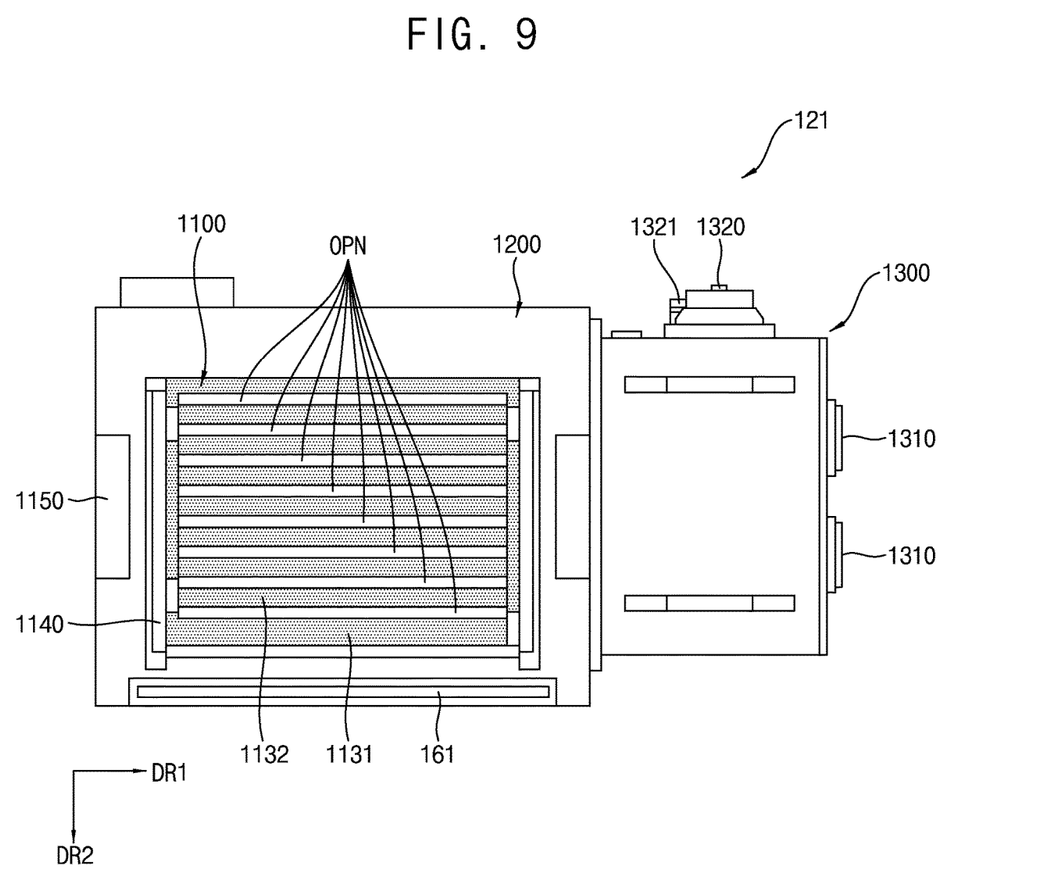
FIG. 9 shows a top view of the first chamber in a state in which the inlets of the first chamber are opened, according to an example embodiment.
Figure 10:
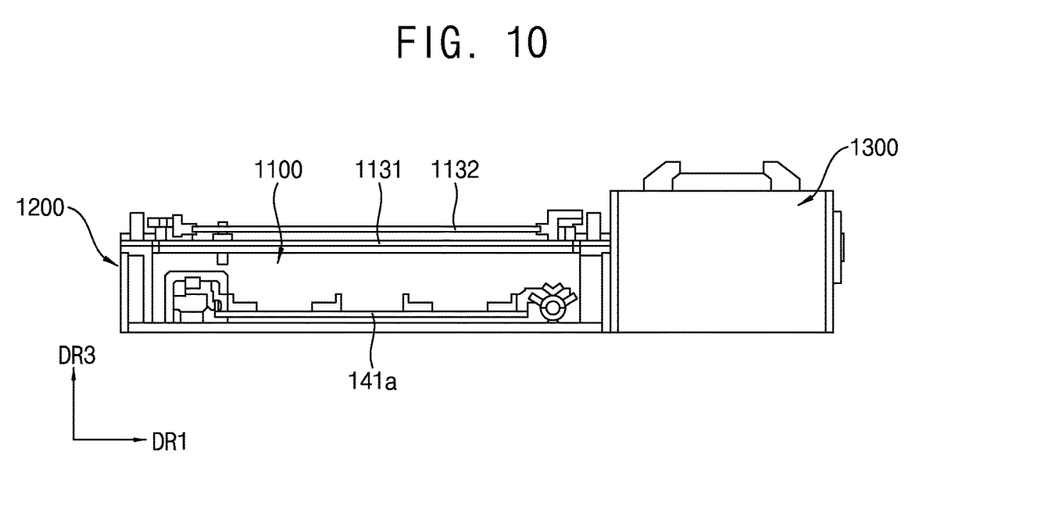
FIG. 10 shows an inner side view of the first chamber in the state in which the inlets of the first chamber are opened, according to an example embodiment.

FIG. 7 shows a top view of the first chamber in a state in which inlets of the first chamber are closed, according to an example embodiment. FIG. 8 shows an inner side view of the first chamber in the state in which the inlets of the first chamber are closed, according to an example embodiment. FIG. 9 shows a top view of the first chamber in a state in which the inlets of the first chamber are opened, according to an example embodiment. FIG. 10 shows an inner side view of the first chamber in the state in which the inlets of the first chamber are opened, according to an example embodiment.

FIGS. 7 to 10 show a state in which the first tray 141*a* is disposed in the first chamber 121.

Referring to FIGS. 7 and 8, the first upper cover 1131 and the second upper cover 1132 may be disposed to contact each other in a vertical direction. The inlets OPN respectively formed at the first upper cover 1131 and the second upper cover 1132 may not overlap with each other. Accordingly, the inlets OPN of the first chamber 121 may be closed.

Referring to FIGS. 9 and 10, in an example embodiment, the second upper cover 1132 may be moved in upward and downward directions and in left and right directions by the cylinder. The second upper cover 1132 may be spaced apart from the first upper cover 1131 by a predetermined distance. In this case, the inlets OPN respectively formed at the first upper cover 1131 and the second upper cover 1132 may overlap with each other. Accordingly, the inlets OPN of the first chamber 121 may be opened.

Figure 11:
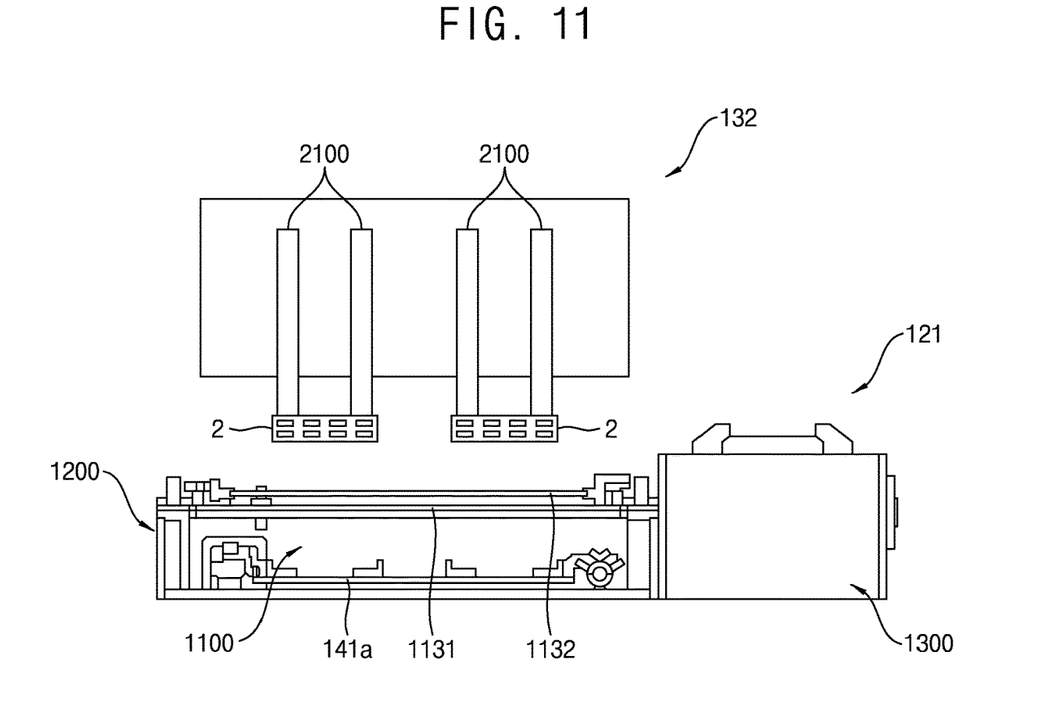
FIGS. 11 to 13 are views showing a procedure in which semiconductor modules are loaded into the first chamber in accordance with an example embodiment.
Figure 12:
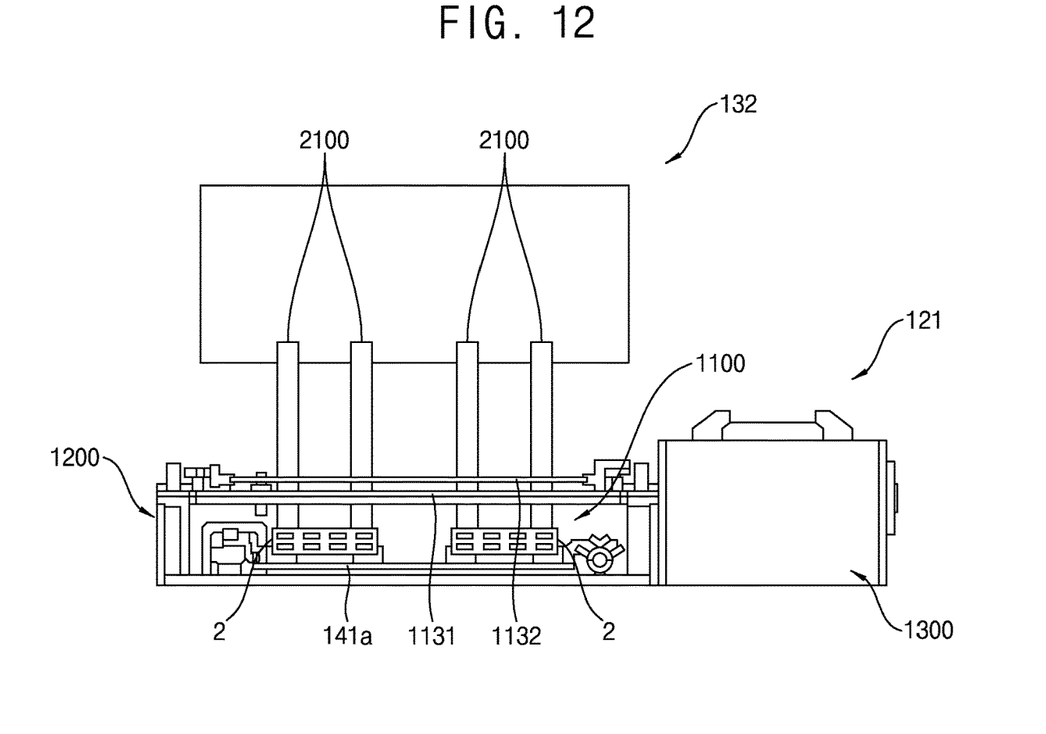
Figure 13:
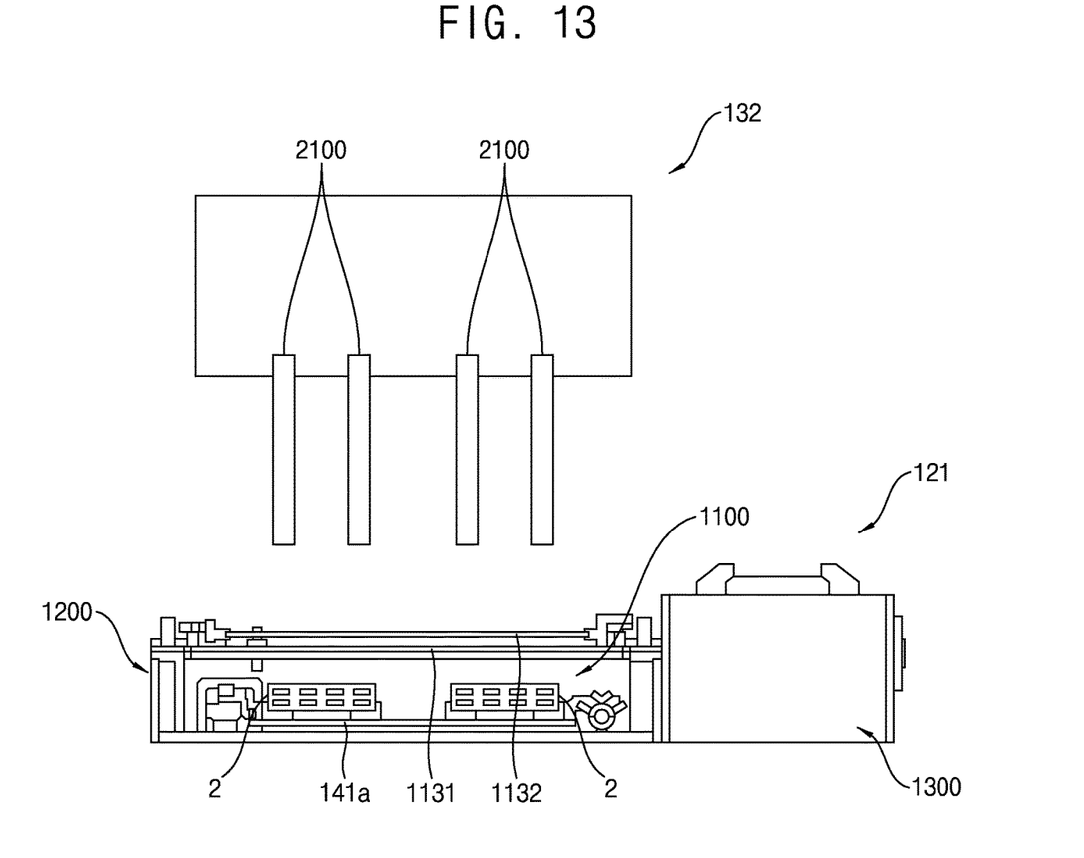

FIGS. 11 to 13 are views showing a procedure in which semiconductor modules are loaded into the first chamber in accordance with the example embodiment.

In this example embodiment, description given with reference to the second robot 132 may be applied to the first robot 131 and the third to fifth robots 133 to 135.

Referring to FIG. 3 and FIGS. 11 to 13, the second robot 132 may include a plurality of grippers 2100 capable of selectively gripping (i.e., gripping or releasing) a semiconductor module 2.

The plurality of grippers 2100 may move in upward and downward directions. In an example embodiment, the second robot 132 may pick up a plurality of semiconductor modules 2 received in the loader 111 through the plurality of grippers 2100 included therein. In addition, the second robot 132 may directly place, in the first chamber 121, the semiconductor modules 2 picked up through the plurality of grippers 2100 included therein, and may then place the semiconductor modules 2 in the first chamber 121.

In an example embodiment, the second robot 132 may be provided in the form of a gantry structure in the inspection device 1. The second robot 132 may independently move in a first direction DR1 (for example, an X-axis direction), a second direction DR2 (for example, a Y-axis direction) and a third direction DR3 (for example, a Z-axis direction) on the loader 111, on the first chamber 121 and between the loader 111 and the first chamber 121. For example, the second robot 132 may repeatedly move on the loader 111 and the first chamber 121.

First, as shown in FIG. 11, the second robot 132 may move to be positioned with respect to the first chamber 121 in a state of picking up a plurality of semiconductor modules 2 received in the loader 111. In this case, the inlets OPN of the first chamber 121 may be in an opened state.

Next, as shown in FIG. 12, in a state in which the inlets OPN of the first chamber 121 are opened, the second robot 132 downwardly moves the grippers 2100 to position the semiconductor modules 2 in the first chamber 121 through the inlets OPN (through the first inlets OPN1 and the second inlet OPN2). In an example embodiment, two semiconductor modules 2 may be placed in the first chamber 121 per inlet OPN. For example, a total of 16 semiconductor modules 2 may be simultaneously placed in the first chamber 121. The second robot 132 may place, on the first tray 141a, the semiconductor module 2 placed in the first chamber 121.

Subsequently, as shown in FIG. 13, the second robot 132 upwardly moves the grippers 2100 such that the gripper 2100 are disposed outside the first chamber 121. When the grippers 2100 of the second robot 132 exit the first chamber 121, the inlets OPN of the first chamber 121 may be switched to a closed state. When the inlets OPN are closed, the internal temperature of the first chamber 121 may be adjusted to a test temperature.

In accordance with example embodiments, the semiconductor module inspection device may directly load or unload semiconductor modules into or from a chamber using a robot and, as such, it may be possible to minimize the test process time and the equipment size of the inspection device.

In addition, the semiconductor module inspection device may perform an electrical performance test for semiconductor modules not only in a high temperature state, but also in a low temperature state.

At least one of the receiver, the loader, the unloader, the stacker, the tray and the robot described herein may include hardware components, such as a support, a gripping mechanism, an electrical motor, a hydraulic mechanism and/or a processor. Moreover, the processor of the receiver, the loader, the unloader, the stacker, the tray or the robot may control components of the receiver, the loader, the unloader, the stacker, the tray or the robot to perform the described functions. The processor may be a hardware processor or a combination of hardware and software modules to perform the described functions, such as a microprocessor. The testing unit may include a processor, such as a hardware processor or a combination of hardware and software modules to perform its functions, and a memory to control tests that are performed on the semiconductor modules.

While example embodiments have been described with reference to the accompanying drawings, it should be understood by those skilled in the art that various modifications may be made without departing from the scope of the disclosure and without changing essential features thereof.

Therefore, the above-described example embodiments should be considered in a descriptive sense only and not for purposes of limitation.

What is claimed is:

1. A semiconductor module inspection device comprising:
a receiver configured to store a plurality of semiconductor modules;
a loader configured to receive a semiconductor module, from among the plurality of semiconductor modules, from the receiver;
a testing unit configured to receive the semiconductor module from the loader, and perform a test process on the semiconductor module;
an unloader configured to receive the semiconductor module from the testing unit, and provide the semiconductor module from the testing unit to the receiver; and
a plurality of robots for transporting the semiconductor module,
wherein the plurality of robots comprises:
a first robot configured to transport the semiconductor module from the receiver to the loader,
a second robot configured to transport the semiconductor module from the loader to the testing unit,
a third robot configured to transport the semiconductor module from the testing unit to the unloader, and
a fourth robot configured to transport the semiconductor module from the unloader to the receiver,
wherein the testing unit comprises:
a first chamber configured to maintain an internal temperature thereof at a predetermined temperature;
a second chamber in which an electrical test process for the semiconductor module is performed at the predetermined temperature; and
a first door configured to selectively connect the first chamber and the second chamber.

2. The semiconductor module inspection device according to claim 1, wherein the second robot is configured to receive the semiconductor module from the loader and directly place the semiconductor module into the first chamber.

3. The semiconductor module inspection device according to claim 1, further comprising a first tray configured to move the semiconductor module between the first chamber and the second chamber.

4. The semiconductor module inspection device according to claim 3,
wherein the first tray is configured to pass through the first door while moving between the first chamber and the second chamber.

5. The semiconductor module inspection device according to claim 3, wherein the second chamber comprises a tester configured to send and receive electrical signals to and from the semiconductor module.

6. The semiconductor module inspection device according to claim 5, further comprising:
a fifth robot configured to transport the semiconductor module from the first tray to the tester.

7. The semiconductor module inspection device according to claim 1,
wherein the testing unit further comprises a third chamber configured to maintain an internal temperature thereof between the predetermined temperature and a normal temperature, and
wherein the semiconductor module inspection device further comprises a second tray configured to move between the second chamber and the third chamber.

8. The semiconductor module inspection device according to claim 7, further comprising a second door configured to selectively connect the second chamber and the third chamber,
wherein the second tray is configured to pass through the second door while moving between the second chamber and the third chamber.

9. The semiconductor module inspection device according to claim 7, wherein the first chamber, the second chamber and the third chamber are arranged in one direction, and
wherein the second chamber is interposed between the first chamber and the third chamber.

10. The semiconductor module inspection device according to claim 1, wherein the receiver comprises a first stacker, a second stacker, a third stacker and a fourth stacker,
wherein the loader is configured to receive the semiconductor module from the first stacker,
wherein the unloader is configured to place the semiconductor module on the third stacker based on the semiconductor module passing a predetermined test according to the test process,
wherein the unloader is configured to place the semiconductor module on the fourth stacker based on the semiconductor module determined to be defective in accordance with the predetermined test, and
wherein the loader is configured to receive another semiconductor module from among the plurality of semiconductor modules from the second stacker after the test process for the semiconductor module stacked in the first stacker is completed.

11. The semiconductor module inspection device according to claim 1, wherein the semiconductor module comprises:
a module substrate;
a plurality of semiconductor packages mounted on one surface of the module substrate; and
a plurality of tabs disposed adjacent to one side of the module substrate, the plurality of tabs being configured to function as input/output terminals for electrical signals.

12. A semiconductor module inspection device comprising:
a first stacker configured to receive a semiconductor module and stack the semiconductor module on other semiconductor modules;
a loader configured to receive the semiconductor module from the first stacker;
a first chamber configured to maintain an internal temperature thereof at a predetermined temperature;
a second chamber configured to perform an electrical test process on the semiconductor module at the predetermined temperature;
a first door configured to selectively connect the first chamber and the second chamber; and
a robot configured to move the semiconductor module from the loader to the first chamber,
wherein the predetermined temperature is between 70° C. and 130° C. or between −60° C. and −20° C.

13. The semiconductor module inspection device according to claim 12, wherein the first chamber comprises:
a first frame constituting a side surface of a chamber and a lower surface of the first chamber;
a second frame disposed at an upper portion of the first frame and constituting an upper surface of the first chamber, the second frame defining a first open area exposing an interior of the first chamber;
a first upper cover disposed in the first open area, the first upper cover having a plurality of first inlets through which the semiconductor module can pass;
a second upper cover disposed on the first upper cover, the second upper cover having a plurality of second inlets through which the semiconductor module can pass;
an air curtain nozzle configured to inject gas toward the plurality of first inlets and the plurality of second inlets; and
at least one heat block configured to adjust a temperature of the second frame, and wherein the second upper cover is configured to move with respect to the first upper cover such that the plurality of second inlets selectively overlap with the plurality of first inlets.

14. The semiconductor module inspection device according to claim 13, wherein the interior of the first chamber and an exterior of the first chamber are spatially connected to each other when the second upper cover is offset such that the plurality of second inlets overlap with the plurality of first inlets.

15. The semiconductor module inspection device according to claim 14, wherein the robot is configured to directly place the semiconductor module into the first chamber through the plurality of first inlets and the plurality of second inlets.

16. The semiconductor module inspection device according to claim 15, wherein the robot comprises a plurality of grippers configured to selectively grip the semiconductor module while moving in upward and downward directions.

17. The semiconductor module inspection device according to claim 13, wherein the air curtain nozzle is configured to inject gas toward the plurality of first inlets and the plurality of second inlets in a state in which the second upper cover is offset such that the plurality of second inlets overlap with the plurality of first inlets.

18. The semiconductor module inspection device according to claim 12, wherein the robot has a gantry structure and is configured to move with respect to the first chamber between the loader and the first chamber.

19. A semiconductor module inspection device comprising:
a first stacker configured to receive a semiconductor module therein;
a loader configured to receive the semiconductor module from the first stacker;
a first chamber configured to receive the semiconductor module from the loader, the first chamber being configured to maintain an internal temperature thereof at a predetermined temperature;
a second chamber comprising a tester configured to send and receive electrical signals to and from the semiconductor module, the second chamber being configured to perform a test process on the semiconductor module at the predetermined temperature;
a third chamber configured to maintain a temperature between the predetermined temperature and a normal temperature;
a first tray configured to move between the first chamber and the second chamber;
a second tray configured to move between the second chamber and the third chamber;
an unloader configured to receive the semiconductor module from the third chamber;
a second stacker configured to receive the semiconductor module;
a third stacker for receiving configured to receive the semiconductor module;

a first robot configured to transport the semiconductor module from the first stacker to the loader;

a second robot configured to transport the semiconductor module from the loader to the first chamber;

a third robot configured to transport the semiconductor module from the first tray and insert the semiconductor module into the tester;

a fourth robot configured to transport the semiconductor module from the third chamber to the unloader; and a fifth robot configured to transport the semiconductor module from the unloader to the second stacker or the third stacker, wherein the fifth robot is configured to place the semiconductor module on the second stacker based on the semiconductor module satisfying predetermined reference values in the test process, and place the semiconductor module on the third stacker based on the semiconductor module not satisfying one of the predetermined reference values in the test process.

* * * * *